(12) United States Patent
Takahashi

(10) Patent No.: US 7,596,851 B2
(45) Date of Patent: Oct. 6, 2009

(54) METHOD OF MANUFACTURING A QUARTZ RESONATOR

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/980,247

(22) Filed: Oct. 29, 2007

(65) Prior Publication Data

US 2008/0116769 A1    May 22, 2008

(30) Foreign Application Priority Data

Oct. 31, 2006    (JP)    ............... 2006-296599

(51) Int. Cl.
*H04R 31/00*    (2006.01)
(52) U.S. Cl. ............... 29/594; 29/25.35; 29/609.1; 29/831; 29/834; 29/835; 216/13; 216/80; 216/97; 310/319; 310/370; 331/158; 331/176
(58) Field of Classification Search ............... 29/25.35, 29/594, 595, 609.1, 831, 834, 835; 331/158, 331/176; 216/13, 80, 97; 310/319, 370
See application file for complete search history.

(56) References Cited

U.S. PATENT DOCUMENTS 4,742,260 A * 5/1988 Shimizu et al. ........ 310/323.16
7,167,061 B2 1/2007 Matsudo et al.
2005/0085615 A1 4/2005 Wenning et al.
2005/0088250 A1 4/2005 Matsudo et al.

FOREIGN PATENT DOCUMENTS

| JP | 2002-188922 | 7/2002 |
|---|---|---|
| JP | 2004-015562 | 1/2004 |
| JP | 2005-098841 | 4/2005 |

* cited by examiner

*Primary Examiner*—Paul D Kim
(74) *Attorney, Agent, or Firm*—Jordan and Hamburg LLP

(57) ABSTRACT

The shape of a crotch portion of a tuning fork of a quartz piece is controlled such that main surfaces of two sheets of original plates, which are made of quartz crystal and the main surfaces thereof are orthogonal to the direction of the Z axis, which is a crystal axis, are bonded so that the plus/minus directions of the X axis, which is another crystal axis, are made in a reverse relation to each other to form a quartz substrate, and masks for forming the outer shape, through which the surfaces of the quartz substrate are exposed, are formed on both front and back surfaces of the quartz substrate in a manner that the mask follows along the outer shape of the quartz piece and the width direction of the outer shape agrees with the X axis, and the quartz substrate is etched to form the outer shape of the quartz piece.

5 Claims, 17 Drawing Sheets

(a)

(b)

(a)

(b)

(a)

(b)

(c)

(a)

(b)

(a)

(b)

(a)

(b)

(a)

(b)

METHOD OF MANUFACTURING A QUARTZ RESONATOR

BACKGROUND OF THE INVENTION

1. Field of the Invention

The present invention relates to a method of manufacturing a tuning fork type quartz resonator, quartz resonators manufactured by the above method of manufacturing, and electronic parts including the quartz resonators.

2. Description of the Related Art

The tuning fork type quartz resonators have long been adopted as a signal source for pacing a wrist watch owing to its being compact, inexpensive and having a low power consumption, and the uses thereof are still expanding.

FIG. 15 shows an example of the tuning fork type quartz resonators. In the drawing, the quartz resonator 1 is provided with a quartz piece (quartz blank) 10 including a base 11, two pieces (a pair) of vibrating arms 12 (12a and 12b) extending in parallel with each other leaving a space from the upper end side of the base 11.

Both main faces of the vibrating arms 12a and 12b are provided with grooves 13 and 14 respectively, which serve to enhance oscillation efficiency and suppress power loss. Excitation electrodes for exciting tuning fork oscillation based on bending vibration are formed in these grooves 13, 14, and on both main faces and both side faces (surfaces toward right and left of the drawing) of the respective vibrating arms 12a and 12b. 15 in the drawing is a crotch portion put between the respective vibrating arms 12a and 12b of the base 11, and the crotch portion 15 is a portion where no electrode is formed. The excitation electrodes are omitted in FIG. 15.

An outline of a conventional manufacturing process of the tuning fork type quartz resonator 1 will be explained here. First, masks are formed, for instance, on both front and back surfaces of, for instance, a Z-cut wafer made of quartz. Then, a large number of mask patterns along the outer shape of the quartz piece 10 and overlapping each other are formed on the masks on both front and back surfaces, and the quartz of the wafer surface is exposed along these mask patterns. Thereafter, wet etching is conducted so that the quartz exposed along the mask pattern is etched from front and back to form an outer shape of the large number of quartz pieces 10 simultaneously. A part of the periphery of the quartz piece 10 is remained as a supporting part without being etched, and the quartz piece 10 is held to the wafer by this supporting part at this time.

After the above-described etching, a metal film is formed by the sputtering method or the like so as to cover the respective quartz pieces 10, then a photosensitive photoresist is applied on the metal film to form a resist film. The resist film is exposed and developed to form a resist pattern so that the metal film is exposed along the pattern of the excitation electrode of the quartz resonator 1. Since the excitation electrodes are formed on the side walls of the vibrating arms 12a and 12b of the quartz piece 10 as explained in the structure of the quartz resonator 1 at the time of forming the resist pattern, it is necessary that the resist remain on the side wall of the quartz piece 10 so as to mask the metal film on the side wall. Therefore, since the side wall of the quartz piece 10 is hard to be exposed compared with the surface thereof, a positive type resist is used as the above-described resist, of which exposed part is changed into soluble and removed at the time of development.

After forming the resist pattern, the metal film is etched along the resist pattern to form excitation electrodes, so that the quartz resonator is manufactured. Thereafter, the resist film is removed and the quartz resonator is cut off from the wafer.

Incidentally, a wafer made of quartz has anisotropy, and when conducting etching, the etching is progressed at a different speed depending on the axis direction of the crystal axis as described in Patent Document 1. Therefore, when the outer shape of the quartz piece is formed by conducting etching from both front and back as described above on the Z-cut wafer, the etching does not progress along the thickness direction of the quartz wafer straightly but spreads in the lateral direction and, as a result, the crotch portion 15 is formed in front and back mirror symmetry. FIGS. 16A and 16B show an example of the front and back shapes of the crotch portion 15 thus formed. Protrusions are formed in a cone shape at the front and back surfaces of the crotch portion 15, and since the protrusions on the front surface side and on the back surface side are formed in mirror symmetry, it is formed in a complicated shape as if a plurality of protrusions are strung in a row seen as a whole of the crotch portion 15.

Furthermore, the tuning fork type quartz resonator 1 has made considerable progress toward downsizing, and following to this tendency, improvement in coverage property of the resist over the side wall at the time of forming electrodes has been requested. So, although the conventional resist application is mainly conducted by what is called spin coating in which while resist is being supplied to the center of a wafer, the wafer is rotated around its vertical axis so that the resist is spread owing to the centrifugal force produced by the rotation, an electrostatic spray method in which resist is jetted from, for instance, a spray nozzle and at the same time an electric charge is given to the resist and wafers so as to enhance the adsorbability of the resist to the quartz piece 10 in the wafer, a dip method in which the quartz piece 10 is immersed into resist liquid, and other methods have been used instead of the spin coating method. The electrostatic spray method will be explained in detail when the present invention is explained.

The crotch portion 15 of the quartz resonator 1, however, is formed complicatedly as described above, and liquid is sometimes apt to stay in a recess formed between protrusions of the crotch portion 15. Accordingly, when the above-described electrostatic spray method or the like is used, anxiety that the following problems might take place comes into existence. FIG. 17A shows the crotch portion 15 when resist is supplied, and 16 in the drawing indicates the resist film, and 17 in the drawing indicates the metal film to compose an excitation electrode.

After supplying the resist, the resist film 16 thus formed is exposed according to the resist pattern as described above. The crotch portion 15, on which electrodes are not to be formed originally, is also exposed, but the resist film 16 is sometimes formed thick on the crotch portion 15 due to the accumulated resist as described above, which may result in occurrence of fear of not being exposed to the extent of the lower layer of the resist film 16. In addition, there is a fear that unexposed portions are created because exposure beams are blocked at the crotch portion 15 due to its complicated shape. In such a case, the resist film 16 sometimes remains at the crotch portion 15 after development as shown in FIG. 17B. When the resist film 16 remains as described above, the metal film 17 below the resist film 16 is not etched. As a result, the metal film 17 remains on the crotch portion 15 after the excitation electrode is formed as shown in FIG. 17C. Once, the metal film 17 remains on the crotch portion 15 which is a region where no metal film is formed in itself in this way, a short circuit occurs between the excitation electrodes of the respective arms 12a and 12b due to the metal film 17, which may result in lowering in yield of the quartz resonator 1.

The above-described Patent Documents 1 and 2 describe a method of managing the structure of the crotch portion 15 to get a cone shape by bonding two pieces of quartz sheets in a manner that respective polarities of the X axes, their crystal axes, are reversed, and forming a tuning fork type resonator from this clad metal in order to obtain an angular velocity sensor. However, there is no description of problems created due to change in the resist application method at the time of forming electrodes in this manner. Although the Patent Document 3 describes that the shape of the crotch portion of a tuning fork gets complicated by etching quartz, there is no description of a means to solve the problem described above.

[Patent Document 1] Japanese Patent Application Laid-open No. 2002-188922 (paragraph 0008 to paragraph 0010)

[Patent Document 2] Japanese Patent Application Laid-open No. 2005-98841 (paragraph 0033 and FIG. 1 to FIG. 3)

[Patent Document 3] Japanese Patent Application Laid-open No. 2004-15562 (paragraph 0006)

SUMMARY OF THE INVENTION

The object of the present invention in producing a tuning fork type quartz resonator from a quartz substrate is to provide a method of manufacturing a quartz resonator capable of suppressing short circuiting between excitation electrodes by restraining staying of a metal film in a crotch portion by controlling existence of resist reservoir in the crotch portion of the tuning fork when forming excitation electrodes on respective tuning fork arms by etching the metal film on the surface of the quartz resonator along a resist pattern formed on the surface thereof.

A method of manufacturing a quartz resonator which includes etching a quartz substrate, forming a quartz piece in a shape of a tuning fork in which two vibrating arms extend from a base, and forming electrodes in areas including side surfaces inside the vibrating arms of the quartz piece, including the steps of:

forming the quartz substrate by bonding main surfaces of two sheets of original plates, which are made of quartz crystal, and the main surfaces thereof are orthogonal to the direction of the Z axis, a crystal axis, so that the plus/minus directions of the X axis, another crystal axis, are made in a reverse relation to each other;

forming an outer shape of the quartz piece by forming masks for the outer shape, through which the surfaces of the quartz substrate are exposed, on both front and back surfaces of the quartz substrate in a manner that the mask follows along the outer shape of the quartz piece and the width direction of the outer shape agrees with the X axis, and by etching the quartz substrate;

forming a metal film to form the electrodes in areas including a crotch portion sandwiched between the side surface inside the respective vibrating arms and the respective vibrating arms of the quartz piece, after removing the mask for the outer shape;

covering the metal film with a positive type resist film, of which exposed portion changes to be soluble;

forming a resist pattern in which the metal film in the areas including the crotch portion is exposed, by exposing and developing the resist film using a mask to form electrode patterns to remove the exposed portions; and then, etching the metal film using the resist pattern to form electrodes.

For instance, one electrode is formed on the side surface inside one vibrating arm from the crotch portion toward the tip of the one vibrating arm, and at the same time, the other electrode is formed on the side surface inside the other vibrating arm from the crotch portion toward the tip of the other vibrating arm, and for instance, one electrode is formed at the edge of the crotch portion on one surface side of the quartz resonator, and the other electrode is formed at the edge of the crotch portion on the other surface side of the quartz substrate. The process to form the resist film is, for instance, the electrostatic spray method or the dip method, and the process to form the outer shape of the quartz piece may be the one to form a crotch portion which is nearly symmetrical with respect to the front and the back and bilaterally symmetrical in a standing state of the quartz piece, and has a slope going down from the center of the width of the quartz piece toward the front and the back.

The quartz resonator of the present invention includes a quartz piece formed in a tuning fork type with two pieces of vibrating arms extending from a base, and including a crotch portion which is sandwiched between one vibrating arm and the other vibrating arm, is nearly symmetrical with respect to the front and the back and bilaterally symmetrical in a standing state of the quartz piece, and has a slope going down from the center of the width of the quartz piece toward the front and the back; and electrodes formed in the areas including the side surfaces inside the vibrating arms of the quartz piece.

Furthermore, an electronic part of the present invention includes the quartz resonator.

According to the present invention, after forming a quartz substrate by bonding two sheets of original plates which are made of quartz crystal, and of which main surfaces are orthogonal to the direction of the Z axis, the crystal axis, so that the plus/minus directions of each X axis, the crystal axis, are in a reverse relation to each other, etching is conducted from both front and back surfaces of the quartz substrate, and the outer shape formation of the quartz piece is conducted in a manner that the width direction thereof agrees with the X axis. Since the directions of the crystal axes are symmetrical between the front and the back of the quartz substrate formed in the manner described above, the etching progresses symmetrically with respect to the front and the back. Furthermore, since the difference in etching speed between axis directions toward +X and −X is small, the crotch portion between the vibrating arms of the quartz piece is formed in a cone shape in nearly symmetrical with respect to the front and the back, and bilaterally symmetrical, so that complication of the shape of the crotch portion is reduced. Accordingly, when a positive type resist is supplied on a metal film after the metal film to be an excitation electrode is formed in the areas including the side surfaces of the vibrating arms of the quartz piece, excessive resist flows down along the slope of the crotch portion, so that accumulation of the resist in the crotch portion is suppressed. Further, since complication of the shape is suppressed at the time of exposing the resist film thereafter, occurrence of unexposed portions on the surface of the crotch portion is suppressed. Accordingly, since staying of the resist film on the crotch portion after exposure and development is suppressed, it is possible to minimize lowering of yields of the quartz resonator caused by staying of the metal film below the resist film in the crotch portion without being removed to cause short circuit of the excitation electrodes on the right and left vibrating arms.

DETAILED DESCRIPTION OF THE PREFERRED EMBODIMENT(S)

Figure 1:
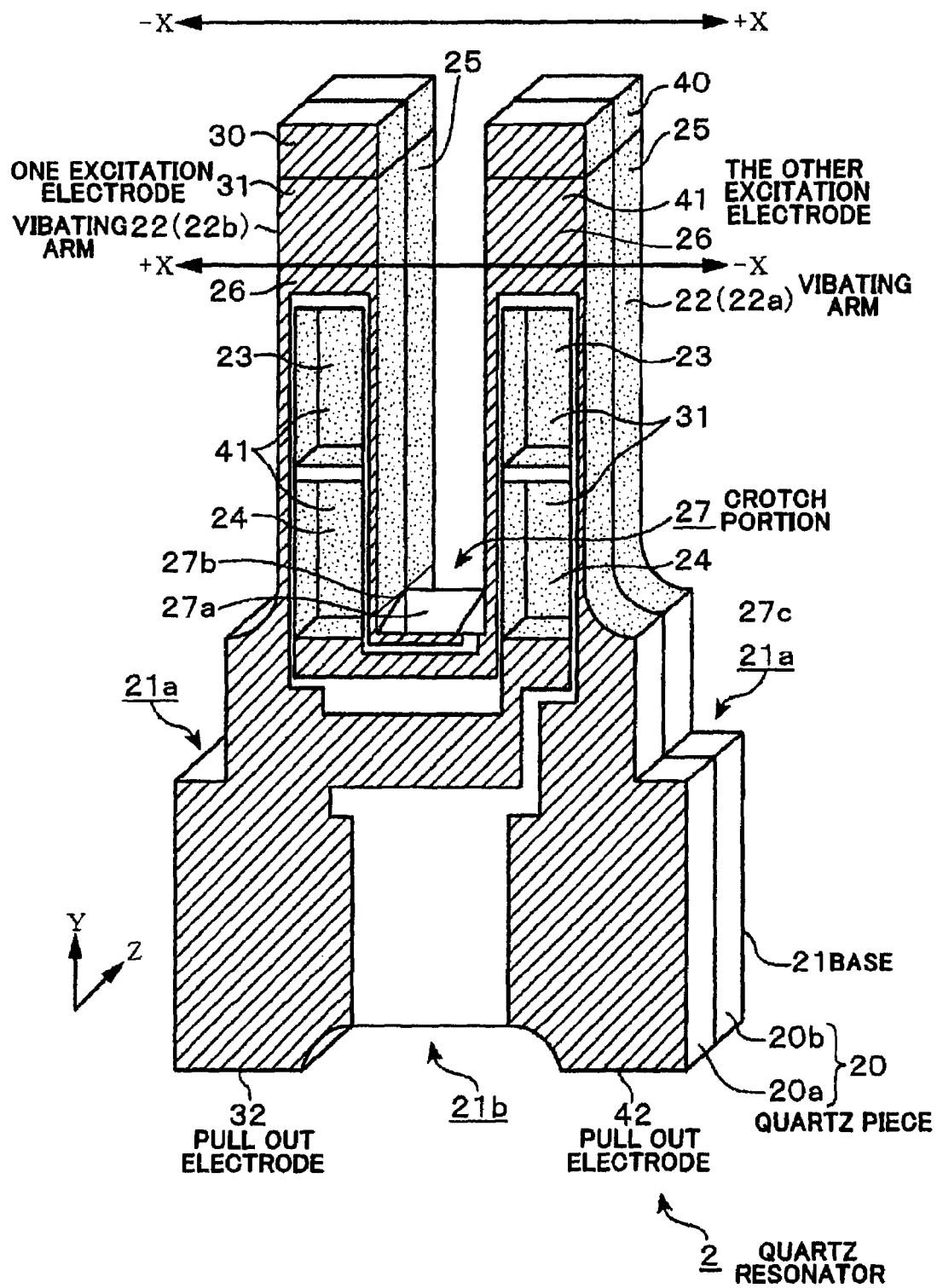
FIG. 1 is a perspective view showing a tuning fork type quartz resonator relating to an embodiment of the present invention.

A method of manufacturing a tuning fork type quartz resonator, a piezoelectric oscillator, will be explained as an embodiment of the present invention. FIG. 1 is a perspective view of a quartz resonator 2 manufactured by this manufacturing method, wherein respective arrows, X, Y, and Z, in the drawing show the crystal axes of quartz crystal composing the quartz resonator 2 respectively. The quartz resonator 2 is formed such that respective directions of length, width, and thickness of the quartz resonator 2 are formed along the Y axis (mechanical axis), the X axis (electrical axis) and the Z axis (optical axis) of the quartz crystal, respectively.

The quartz resonator 2 is provided with a quartz piece 20, of which structure is nearly symmetrical with respect to the front and the back and bilaterally symmetrical. The quartz piece 20 is composed of two sheets of segments 20a and 20b, of which directions toward +X and −X are bilaterally opposite, and which are bonded to each other, as shown in the drawing. It is structured such that when seen the quartz resonator 2 in a standing state from the front side, the right side surface of the segment 20a faces in the axis direction toward −X, and when seen it from the back side, the right side surface of the segment 20b faces in the axis direction toward −X.

The quartz piece 20 includes: a nearly square base 21 having a notch part 21a which is made by cutting out the upper sides of both sides in a rectangle, and a notch part 21b which is made by cutting out the lower central portion upwards; and two pieces (a pair) of vibrating arms 22 (22a and 22b) extending from the upper end of the base 21 in the Y axis direction in parallel leaving a space between each other respectively. Grooves 23 and 24 serving to enhance oscillation efficiency and to suppress power loss are provided on both main surfaces of the vibrating arms 22a and 22b.

When focusing on the vibrating arm 22a between the vibrating arms 22, one electrode group, excitation electrodes 31, are formed in the whole inside surfaces of the two grooves 23 and 24 of the vibrating arms 22a, and a portion between the groove 23 and the groove 24. In other words, the excitation electrodes 31 in the respective grooves 23 and 24 of the vibrating arms 22a are bonded to each other by the oscillation electrode 31 formed on a bridge part which corresponds to the place between the grooves 23 and 24. The other electrode group, excitation electrodes 41, are formed on both side surfaces 25 and 25 of the vibrating arm 22a, and the upper part of the second groove 23 on the tip side in the main surfaces 26 and 26 (front side and back side).

An adjusting weight 40, which is a metal film to adjust oscillation frequency by adjusting the weight of the adjusting weight is provided at the tip of the vibrating arm 22a. The adjusting weight 40 is a part of the excitation electrode 41, but differs from electrodes in other parts in thickness and electrode material. Note that, the excitation electrodes 31 and 41 in FIG. 1 are expressed by using slant lines and dots separately for the respective electrodes to make the drawing easier to see. Accordingly, the slant lines in FIG. 1 does not indicate the section of the quartz piece 20.

Furthermore, when focusing on the vibrating arms 22b, the other electrode group, excitation electrodes 41, are formed in the whole inside surfaces of the two grooves 23 and 24 of the vibrating arms 22b, and a portion between the respective groove 23 and groove 24. The one of the electrode group, excitation electrodes 31, are formed on both side surfaces 25 and 25 of the vibrating arm 22b, and the upper part of the second groove 23 on the tip side in the main surfaces 26 and 26 (front side and back side).

An adjusting weight 30 to adjust oscillation frequency by adjusting the weight is similarly provided also at the tip of the vibrating arm 22a. The arrangement of the electrodes provided on the vibrating arms 22a and 22b are the same with each other except that the excitation electrodes 31 and 41 are in a reverse relation to each other. An electrode pattern composed of a pull out electrode 32 is formed on the surface of the base 21 so that the one group, the excitation electrodes 31, are electrically connected to each other, and at the same time, another electrode pattern composed of a pull out electrode 42 is formed on the surface of the base 21 so that the other group, the excitation electrodes 41, are connected to each other.

Figure 2:
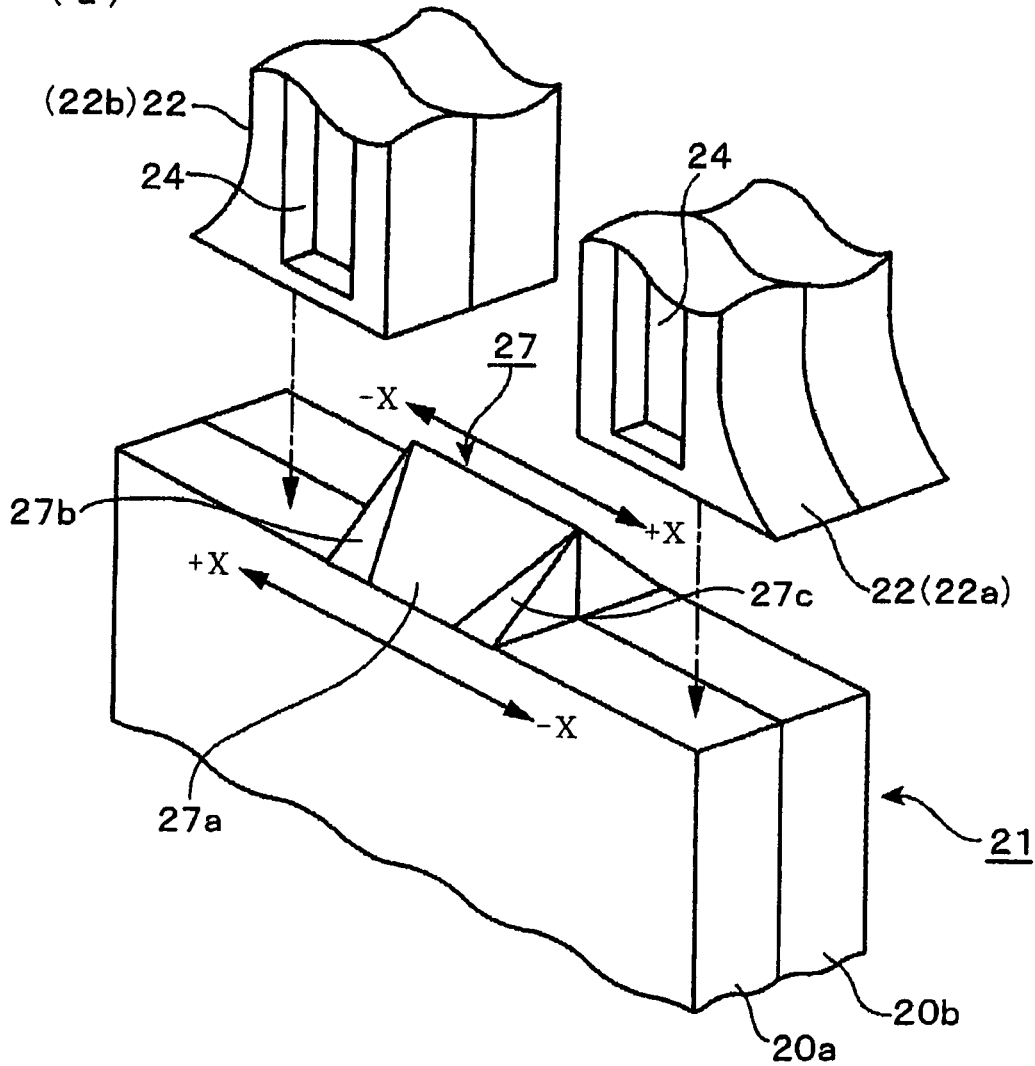
FIGS. 2A and 2B are explanatory drawings showing the configuration of a crotch portion of the quartz resonator.
Figure 2:
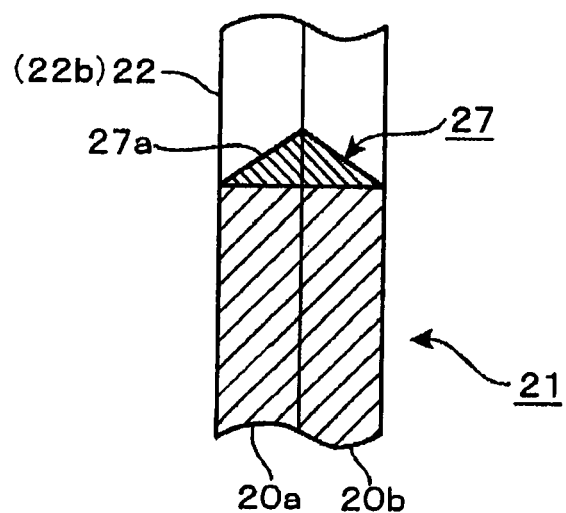

27 in the drawing indicates a crotch portion sandwiched between the vibrating arms 22a and 22b above the base 21. FIG. 2A and FIG. 2B are a perspective view and a vertical section side view of the crotch portion 27 respectively. As shown in these drawings, the crotch portion 27 are formed in a cone shape nearly symmetrical with respect to the front and the back and bilaterally symmetrical, and the slope of the cone is formed to go down from the center of the width of the quartz resonator 2 toward the front and the back. The main slope 27a of the crotch portion 27 is composed of a plane called an R-plane of quartz crystal, and the right and left slopes 27b and 27c are composed of an r-plane of the quartz crystal. This occurs because of the etching speed by the etching liquid being R>r. Note that the electrode patterns are not shown in FIGS. 2A and 2B.

Figure 3:
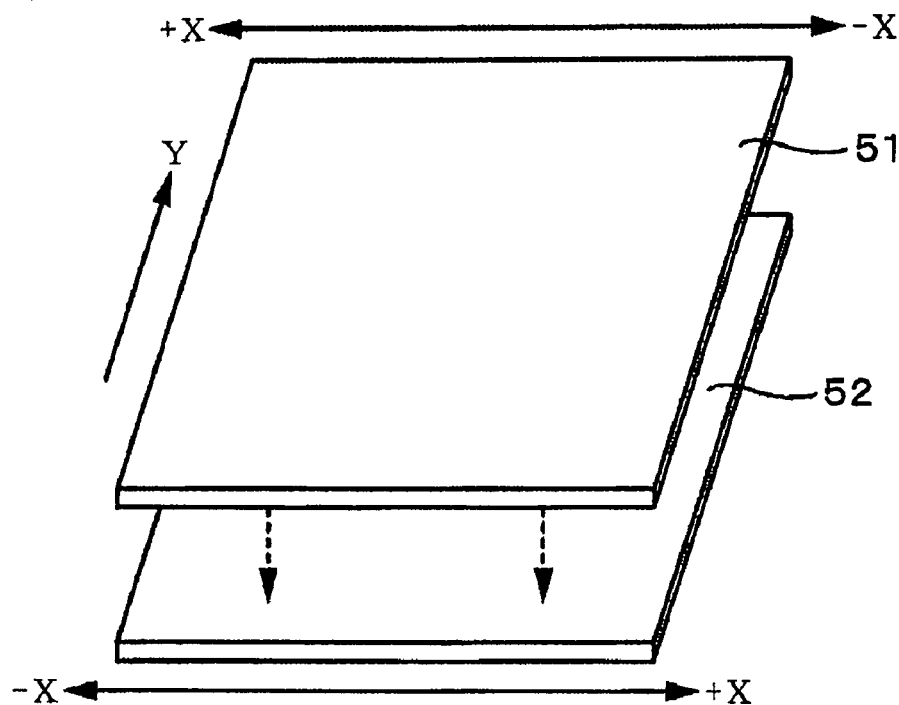
FIGS. 3A and 3B are explanatory drawings showing the configuration of clad metal to manufacture the quartz resonator.
Figure 3:
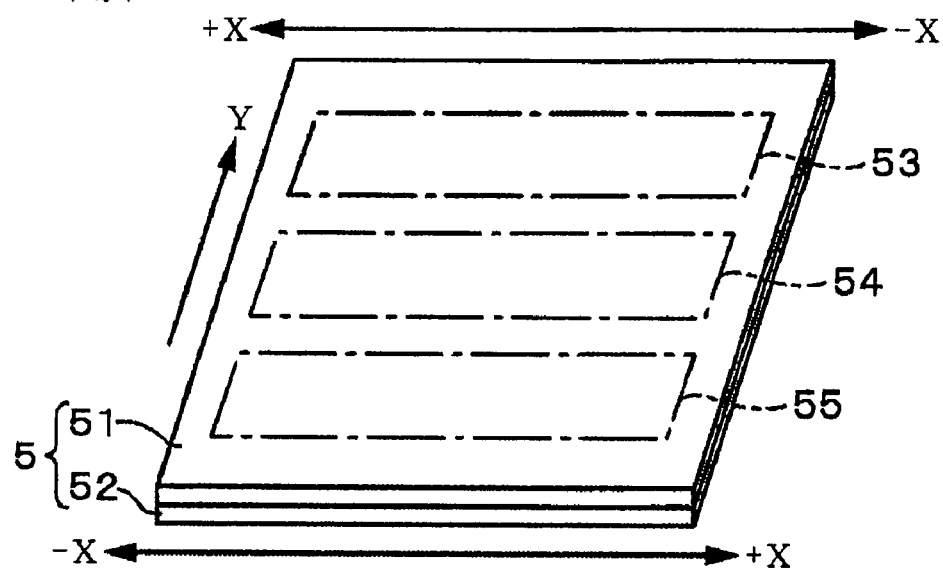

A bonded plate 5 which is a quartz substrate to form the above-described quartz resonator 2 will be explained with reference to FIGS. 3A and 3B. The clad 5 is composed of two sheets of original plates 51 and 52, of which main surfaces are orthogonal to the Z axis, the crystal axis of the quartz crystal, namely, a Z-cut Z plate, and as shown in FIGS. 3A and 3B, these original plates 51 and 52 are bonded to each other in a manner that the respective axis directions toward +X and −X are reversed to each other by 180° and the Y axis directions agree with each other. The segment 20a composing the front surface (one surface) side of the above-described quartz piece 20 is formed from the original plate 51, and the segment 20b composing the back surface (the other surface) side of the quartz piece 20 is formed from the original plate 52.

A process to perform the bonding will be explained. First, the surfaces of the original plates 51 and 52, which are to be bonded to each other, are mirror polished and are made into hydrophilic (OH group formation). Thereafter, the surfaces of the original plates 51 and 52 to be bonded are placed to face each other and pressed to be temporarily bonded. After performing the temporary bonding, the original plates 51 and 52 thus temporarily bonded are heated at a temperature lower than 573° C., which is the Curie temperature of quartz crystal (transition temperature), for instance, at 500° C. to 570° C. Hydrogen dioxide ($H_2O$) is vaporized at the interface of the temporarily bonded original plates 51 and 52 by the heating, and a siloxane bonding (Si—O—Si) is formed between the original plates 51 and 52 so that the original plate 51 and the original plate 52 are bonded with a high bonding strength to form the bonded plate 5. It is preferable for a series of processes after the treatment to make the plates into hydrophilic to be conducted in a vacuum circumstance for the purpose to avoid an outbreak of bubbles on the surfaces to be bonded. It is also possible to bond the original plates 51 and 52 by thermo-compression bonding or ultrasonic compression bonding.

Figure 4:
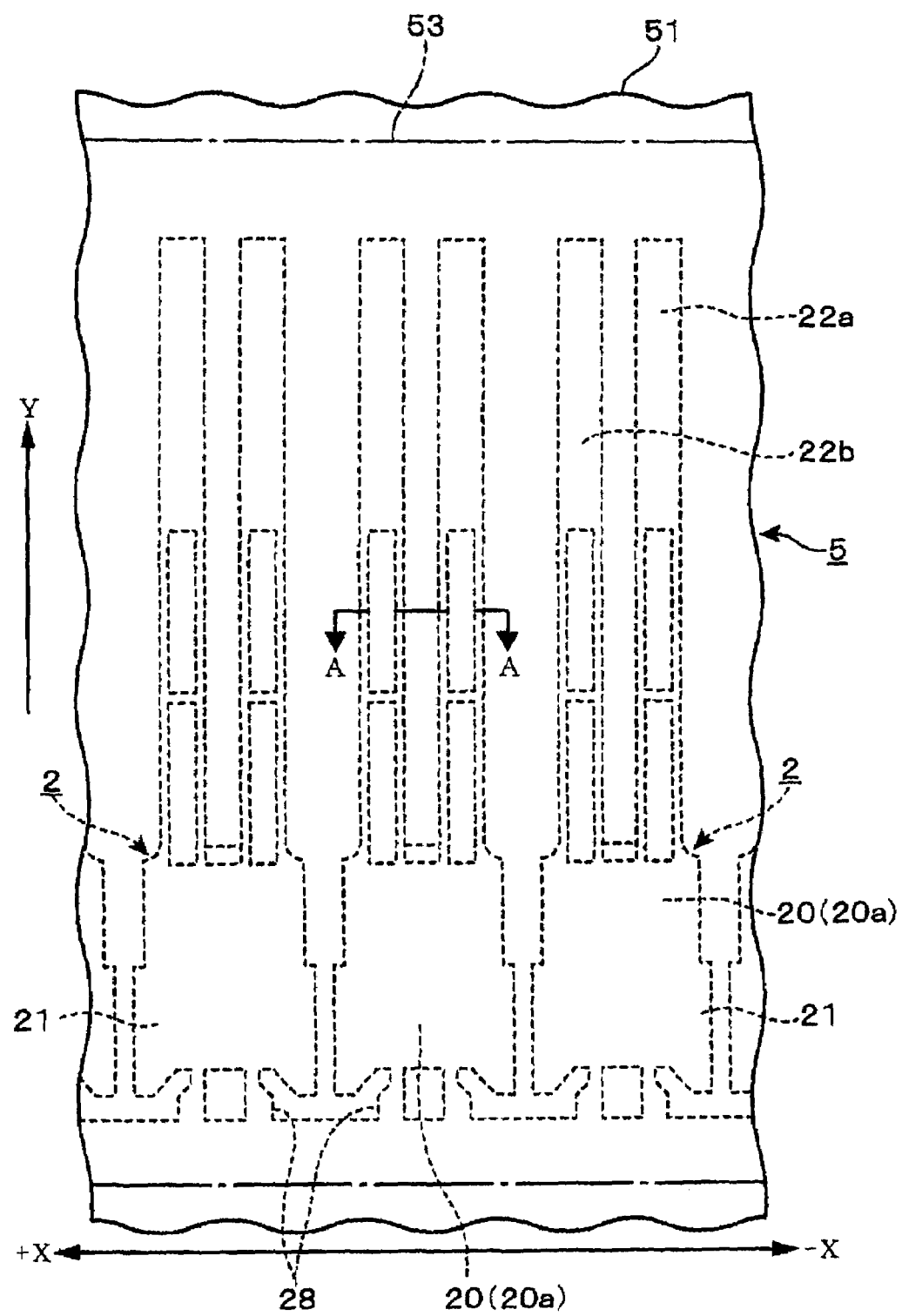
FIG. 4 is a top view showing a region to form the quartz resonator made of a clad metal.
Figure 5:
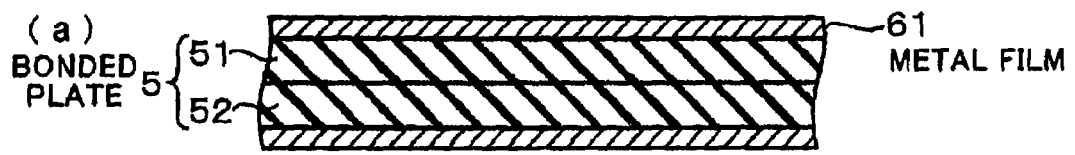
FIGS. 5A to 5E are schematic sectional views showing a method of manufacturing the tuning fork type quartz resonator relating to an embodiment of the present invention.
Figure 5:
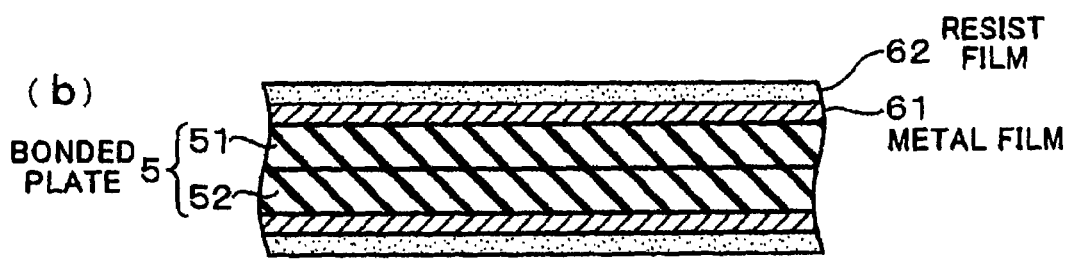
Figure 5:
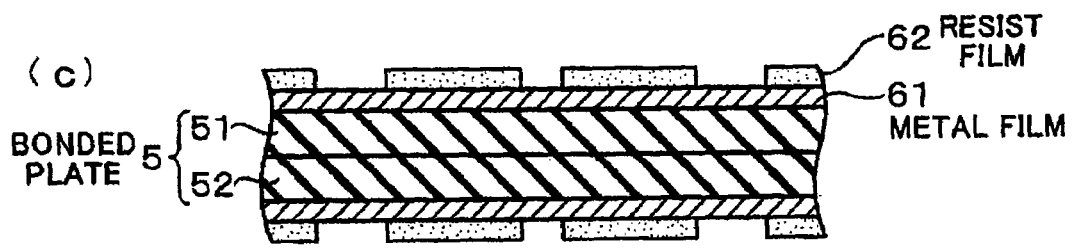
Figure 5:
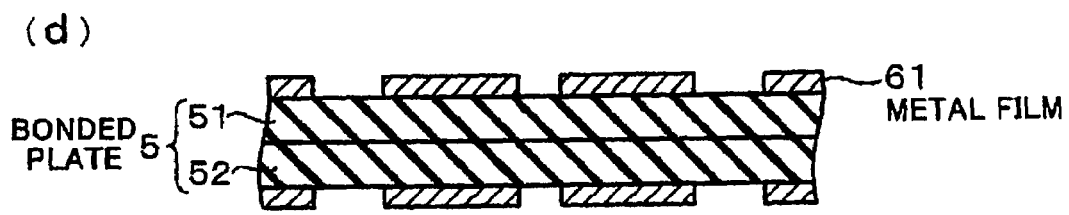
Figure 5:
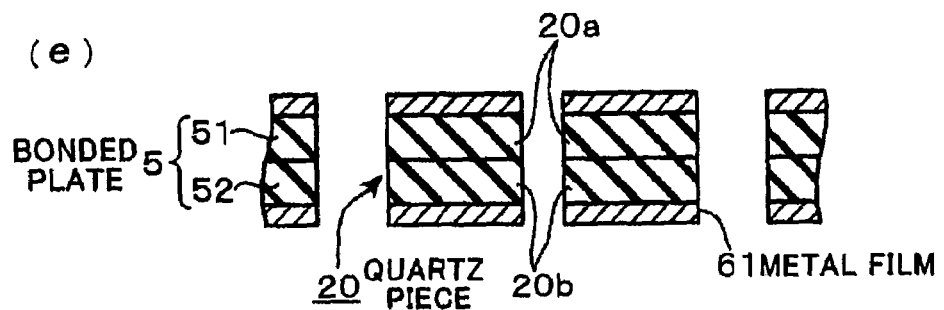
Figure 6:
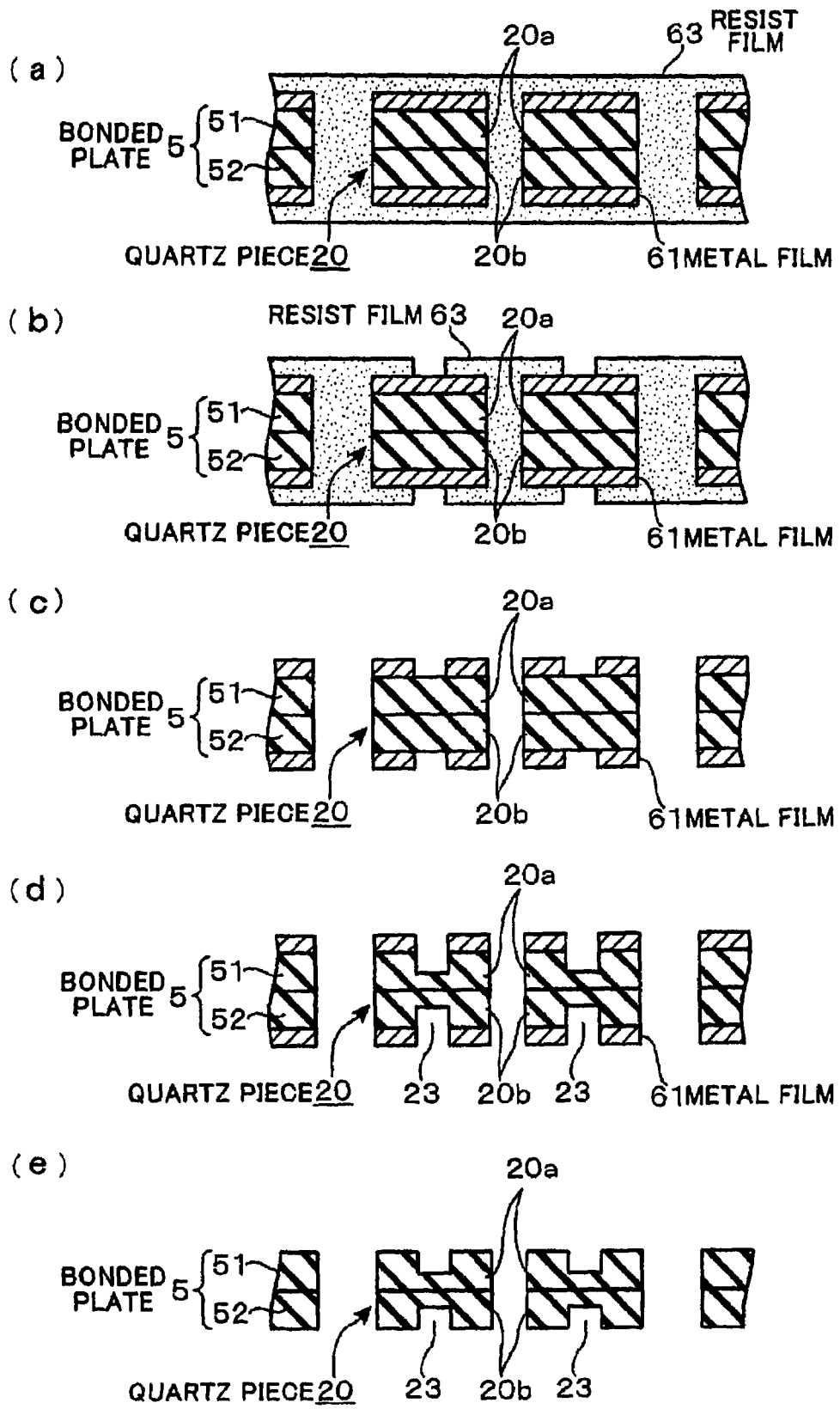
FIGS. 6A to 6E are schematic sectional views showing the method of manufacturing the tuning fork type quartz resonator relating to the embodiment of the present invention.
Figure 7:
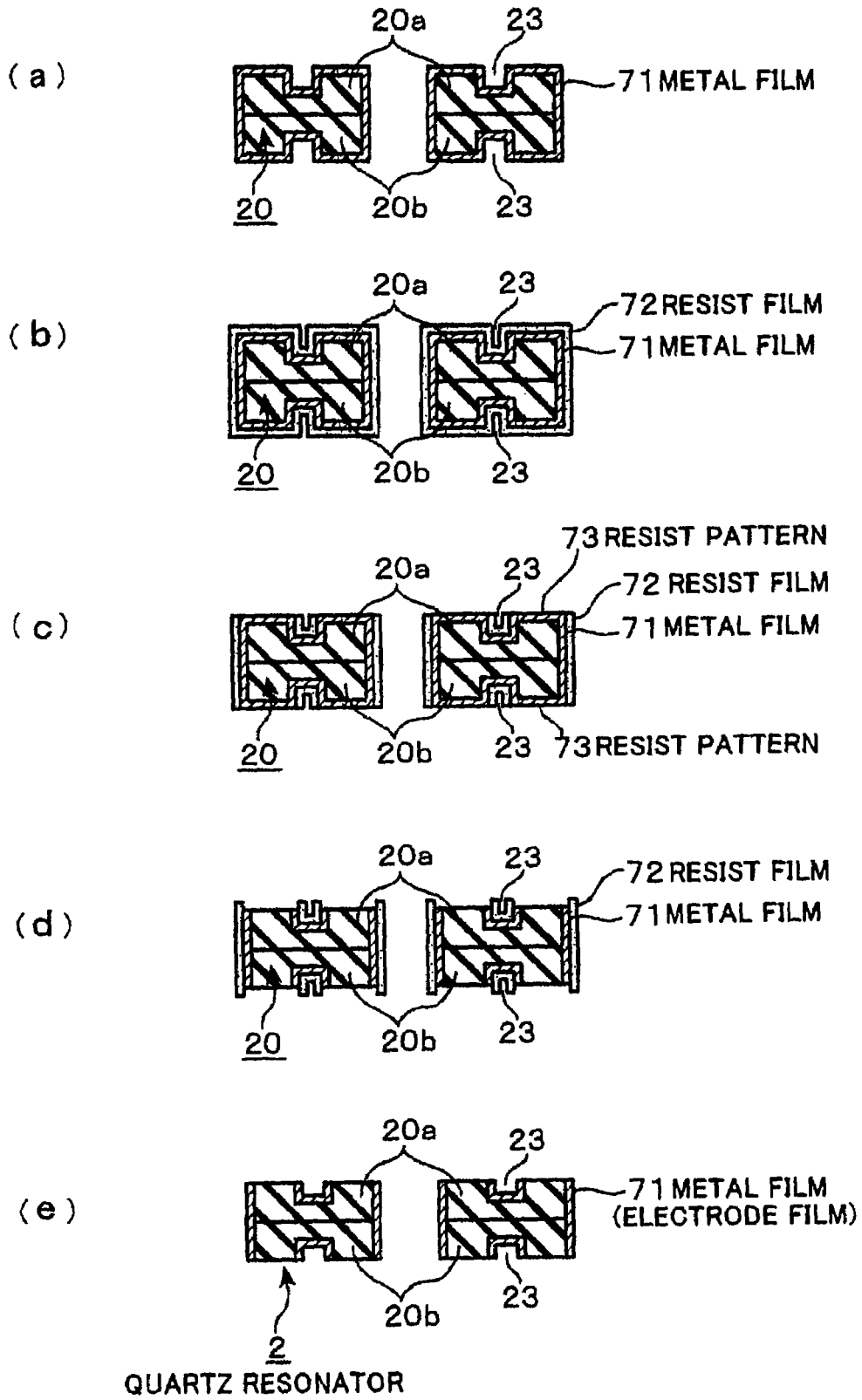
FIGS. 7A to 7E are schematic sectional views showing the method of manufacturing the tuning fork type quartz resonator relating to the embodiment of the present invention.

The areas 53, 54 and 55 shown by chain lines in FIG. 3B indicate the areas where the above-described quartz resonators 2 are formed, and FIG. 4 shows the surface of the quartz resonator forming area 53. As shown in the drawings, in the forming area 53, a large number of the quartz resonators 2 are formed along the X axis direction in a manner that the right side surfaces of the segments 20a and 20b composing the quartz piece 20 face in the axis direction toward −X, and the length direction of vibrating arms 22a and 22b agrees with the Y axis direction. Next, using FIG. 5A to FIG. 7E, the processes of forming the quartz resonator 2 from the bonded plate 5 will be explained by explaining the manner in the change of the cross section of the bonded plate 5 along the X axis at the area shown by the arrows A-A in the forming area 53 in FIG. 4 where the vibrating arms 22 of the quartz resonator 2 are formed. Note that the processes hereafter will be conducted to the whole bonded plate 5, and a large number of the quartz resonators 2 are formed from other forming areas 54 and 55 similarly to the forming area 53.

First, metal films 61 are formed on both front and back surfaces of the forming area 53 by the sputtering method (FIG. 5A). For the metal film 61, a film consisting of gold (Au) deposited on a backing film made of, for instance, chromium (Cr) is used. Then, photoresist is applied on such a metal film 61 by, for instance, the electrostatic spray method (FIG. 5B). The photoresist is exposed and developed so as to get a pattern having the shape of the quartz piece 20, namely, a tuning fork shape, to form a tuning fork shaped resist film 62 (FIG. 5C). The electrostatic spray method will be explained later.

Thereafter, the bonded plate 5 is immersed in a potassium iodide (KI) solution to conduct wet etching, using the above-described resist film 62 as a mask to remove a portion of the metal film 61 not covered with the resist film 62, then the whole resist film left on the bonded plate 5 is peeled off (FIG. 5D). Then, the bonded plate 5 is immersed in hydrofluoric acid which serves as an etching solution using the above-described metal film 61 as a mask to conduct wet etching so as to form the outer shape of the quartz piece 20 (FIG. 5E).

Figure 8:
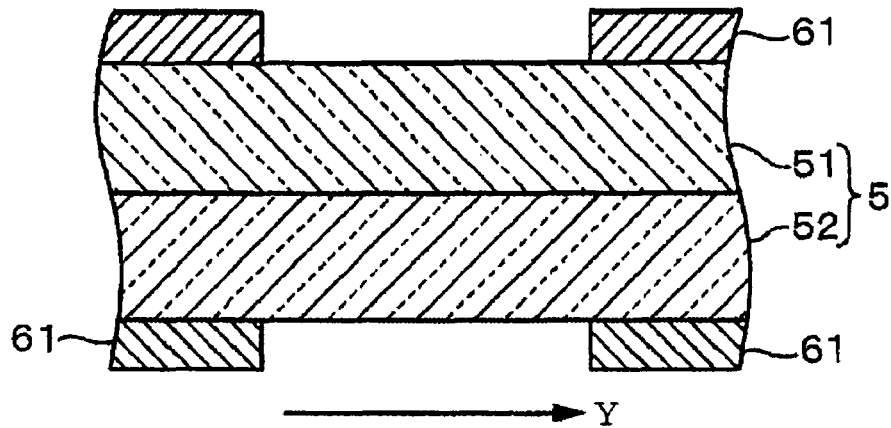
FIGS. 8A, 8B, and 8C are explanatory views showing a manner of forming the crotch portion by etching.
Figure 8:
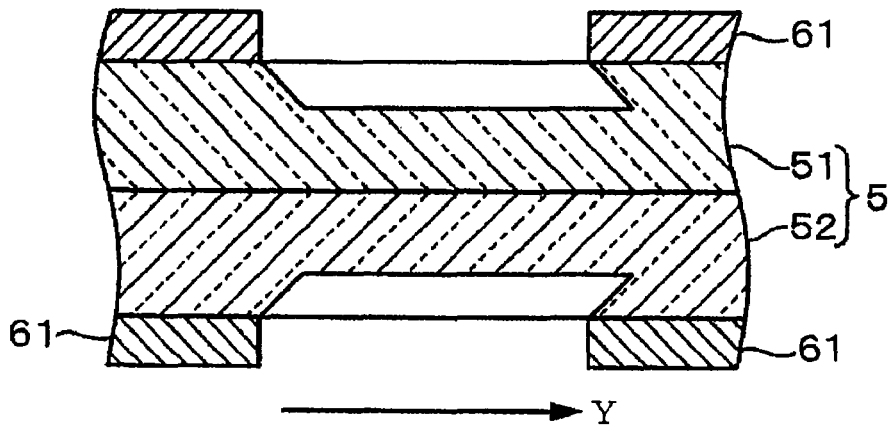
Figure 8:
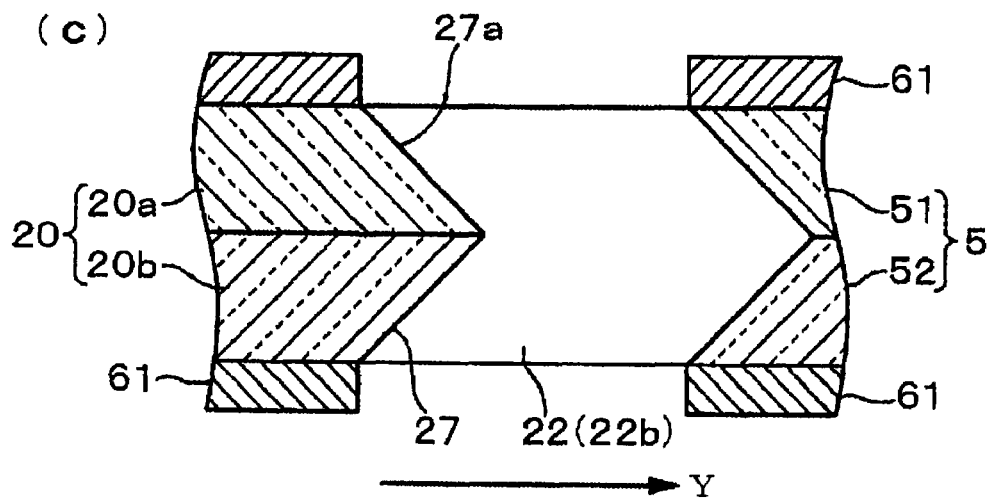

The crotch portion 27 is considered to be formed as follows, when the etching is conducted. FIGS. 8A, 8B, and 8C show a manner in which the section in the Y axis direction at the crotch portion 27 is varied by etching. As described above, crystals are formed slantwise from the front and the back surfaces toward the interface of the two segments of the bonded plate 5 in the bonded plate 5 as shown by dot lines in FIG. 8A, with a symmetric property in direction with respect to the front and the back, and etching progresses along the directional property of the crystal as shown in FIG. 8B. Since the original plates 51 and 52 are bonded together such that their directions toward −X and +X are reversed to each other, etching progresses in the thickness direction (in the Z direction) from the front and the back at the same speed in the bonded plate 5, and the difference in the etching speed between the axis directions toward +X and −X is small. As a result, as shown in FIG. 8C, the crotch portion 27 is formed in a cone shape nearly symmetrical with respect to the front and the back and laterally symmetrical as shown in FIG. 8C.

Back to FIGS. 6A to 6E, the processes after forming the outer shape of the quartz piece 20 will be explained. Photoresist is next applied on the whole surface of the bonded plate 5 by, for instance, the spray method to form a resist film 63 (FIG. 6A). Then, the resist film 63 at a portion corresponding to the grooves 23 and 24 shown in FIG. 1 is peeled off (FIG. 6B). In the process shown in FIG. 6B, it is also adoptable to peel off the resist film 63 at a portion corresponding to the grooves 23 and 24 of the vibrating arm 22, and at the same time to peel off the other resist film 63 so that it remains in the inside of the outer shape of the quartz piece 20 formed in the previous process. Next, the bonded plate 5 is immersed in a potassium iodide (KI) solution to conduct wet etching, using the above-described resist film 63 as a mask to remove the metal film 61 at a portion where the resist film 63 is peeled off, and then, whole resist film 63 remained on the bonded plate 5 is peeled off (FIG. 6C).

Figure 9:
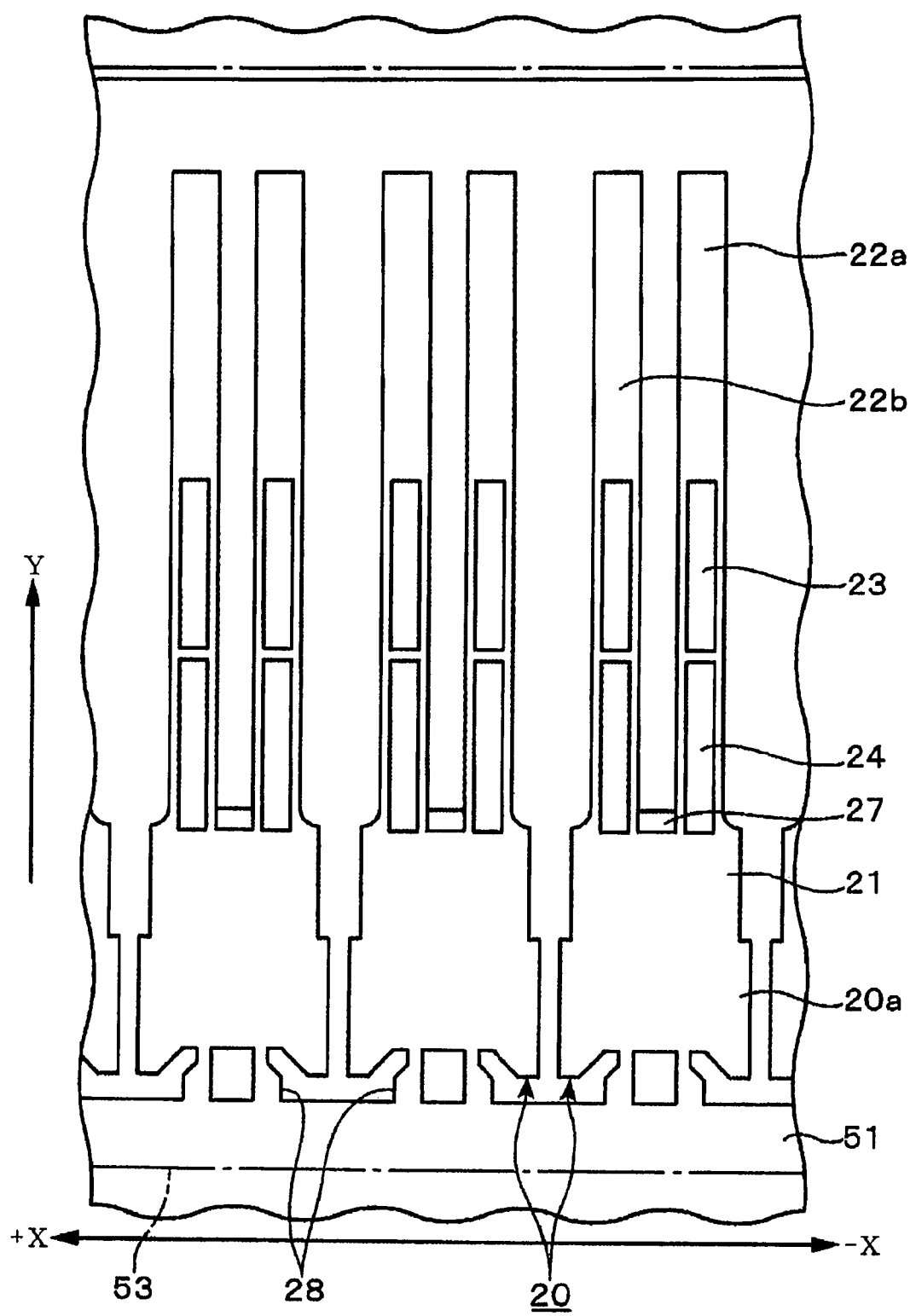
FIG. 9 is a top view showing a quartz piece formed in the above-described region to form the quartz resonator.

Thereafter, the bonded plate 5 is immersed in hydrofluoric acid, which serves as an etching solution, using the above-described metal film 61 as a mask to conduct wet etching so as to form the grooves 23 and 24 on both main surfaces of the quartz piece 65 (FIG. 6D). When the resist film 63 is planed to stay in the inside of the outer shape of the quartz piece 20 formed in the previous process, for instance, a step or a plurality of steps are formed at the edge of the quartz piece 20. Then, the metal film 61 staying on the bonded plate 5 is removed (FIG. 6E). The outer shape of the quartz piece 20 with no electrode pattern is manufactured by the above processes as shown in FIG. 9. The respective quartz pieces 20 are supported to the bonded plate 5 by a supporting part 28 connecting the base 21 of the quartz piece 20 staying without being etched with the edge of the forming area 53.

Next, the process to form an electrode pattern will be explained. First, a metal film 71 to be an electrode is formed on both surfaces of the original form 6 (FIG. 7A). For the metal film 71, a film consisting of gold (Au) deposited on a backing film made of, for instance, chromium (Cr) is used. Next, photoresist is applied on the metal film 71 by the electrostatic spray method.

Figure 10:
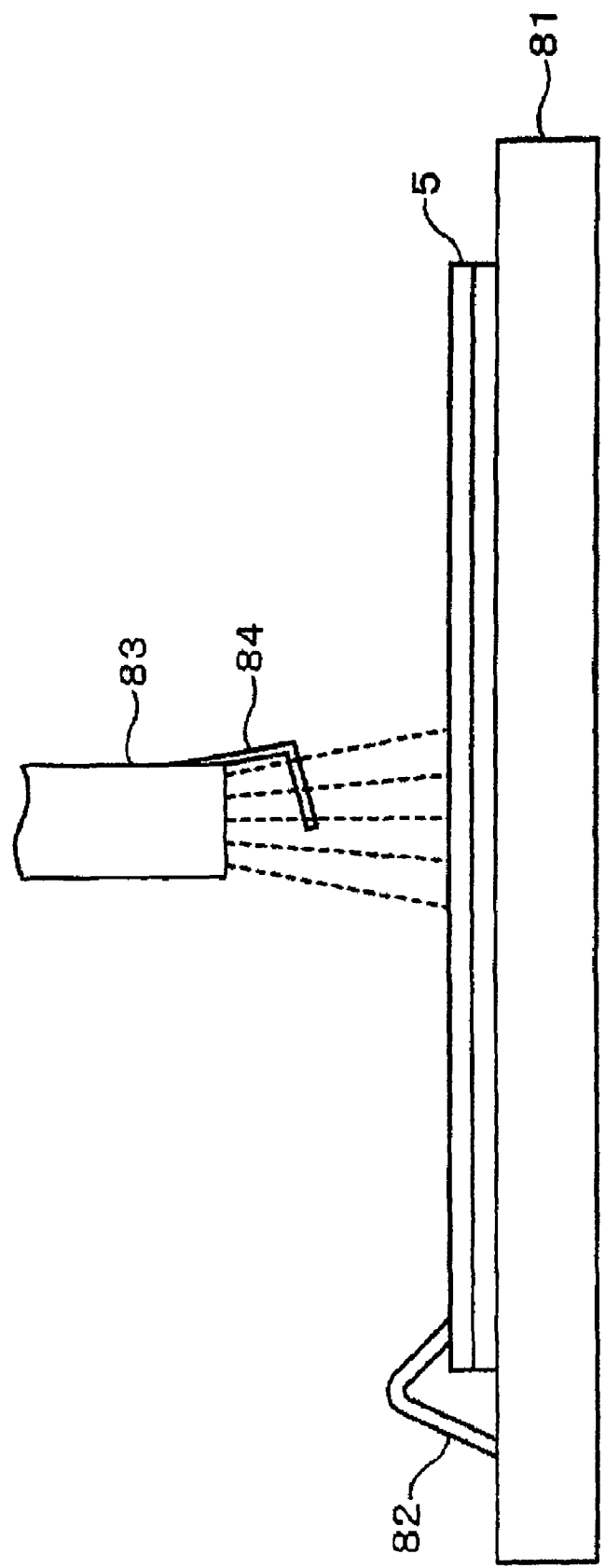
FIG. 10 is a configuration diagram showing an equipment structure to conduct an electrostatic spray method in the above-described manufacturing method.

FIG. 10 shows the device configuration to perform the above-described electrostatic spray method. 81 in the drawing is a stage to mount the bonded plate 5, and positive charges are applied on the surface of the stage 81. 82 in the drawing is an electrode connected to the bonded plate 5 and the stage 81, and when positive charges are applied to the stage 81, the positive charges are to be applied on the surface of the bonded plate 5 via an electrode 82. 83 in the drawing is a spray nozzle to apply resist by spraying, which moves on the stage 81 horizontally to apply the resist on the quartz piece 20, and the resist sprayed from the nozzle 83 is applied negative charges with an electrode needle shown by 84 in the drawing.

Since the excitation electrodes 31 and 41 of the quartz resonator 2 are formed also on the side wall of the quartz piece 20, as explained in the section of related art, it is necessary that the side wall of the quartz piece 20 is covered by resist for the purpose of masking the electrode when performing exposure and development process conducted after the resist coating, and for the resist supplied from the spray nozzle 83, a positive type resist is used, of which exposed portion changes to be soluble and removed after development. When the resist is applied on the front and back surfaces of the bonded plate 5 by the nozzle 83, it is supplied in a manner that the affinity of the resist to the side surface of the quartz piece 20 is enhanced and the whole of the quartz piece 20 is covered with the resist by applying electric charges on the bonded plate 5 and the resist.

Figure 11:
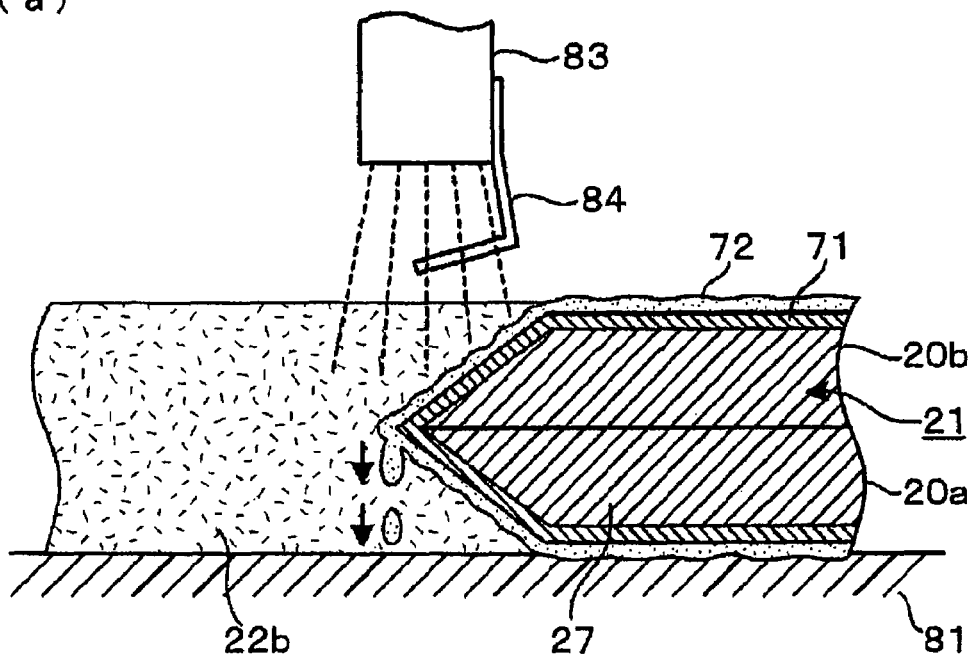
FIGS. 11A and 11B are explanatory views showing a manner that a resist is supplied to the above-described crotch portion and a manner that the crotch portion is exposed.
Figure 11:
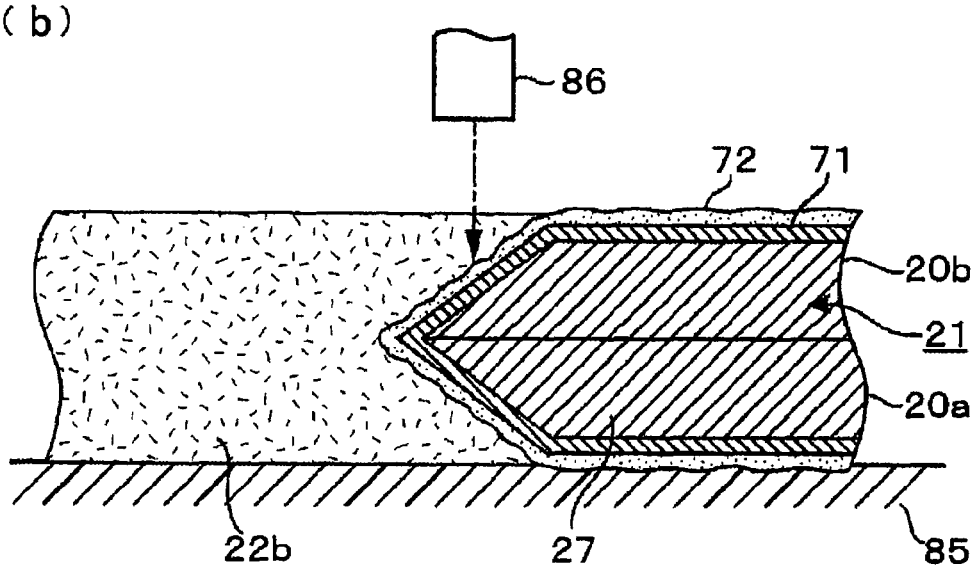

FIG. 11A shows the manner of the crotch portion 27 when the resist is applied as described above, since the crotch portion 27 is formed in a cone shape as shown in this drawing, when the resist is supplied excessively to the crotch portion 27, the resist flows on the slope of the crotch portion 27 and falls down on the stage 81.

After the resist is supplied and the resist film 72 is formed on the metal film 71 as described above (FIG. 7B), the bonded plate 5 is transferred to an exposing device and the resist film 72 is exposed along the electrode pattern. FIG. 11B shows a manner that the crotch portion 27 is exposed, and 85 and 86 in the drawing are an exposure stage mounting the bonded plate 5, and an irradiating unit to irradiate an exposure beam as shown by a chain line, respectively. Since electrodes are not formed on the crotch portion 27, the whole surface thereof is exposed, and since the front surface side and the back surface side of the crotch portion 27 are open upward, the exposure beam is supplied to the crotch portion 27 without being blocked.

After the exposure, development treatment is conducted and the exposed portion of the resist film 72 is peeled off so as to form a resist pattern 73 corresponding to the shapes of the excitation electrodes 31, 41 and the pull out electrodes 32 and 42, and the metal film 71 is exposed (FIG. 7C), and thereafter, the metal film 71 exposed along the resist pattern 73 is etched to form an electrode pattern (FIG. 7D). Then, all resist film 72 remained is peeled off (FIG. 7E), the quartz resonator 2 is manufactured. The quartz resonator 2 thus manufactured is broken off from a supporting portion 28, and cut apart from the bonded plate 5.

Furthermore, as shown in FIG. 1, when forming the adjusting weights 30 and 40, which are metal films, provided at the tip in the vibrating arms 2a, after the process to form the grooves 23 and 24 on both main surfaces of the quartz piece 20 shown in FIG. 6D, photoresist is applied on the surface of the bonded plate 5 by, for instance, the electrostatic spray method, to form a resist film. Then, the resist film is left only on the tip portion of the vibrating arms 22a and 22b shown in FIG. 1 by photolithography, and all of the resist film on the other portions is peeled off. Next, the bonded plate 5 is immersed in a potassium iodide (KI) solution to conduct wet etching so as to remove the metal film 61 at the portion where the resist film is peeled off, and then, the resist films remaining on the tip of the vibrating arms 22a and 22b is peeled off.

Thereafter, the processes to form an electrode pattern shown in the above-described FIGS. 7A to 7E are conducted. As shown in the above, the metal film 61 used for a mask to form the grooves 23 and 24 on both main surfaces of the quartz piece 20 is left only on the tip of the vibrating arms 22a and 22b, and the electrode film pattern is formed. Accordingly, since the adjusting electrode film at the tip becomes thick, the adjusting width of an oscillation frequency can be expanded.

Figure 12:
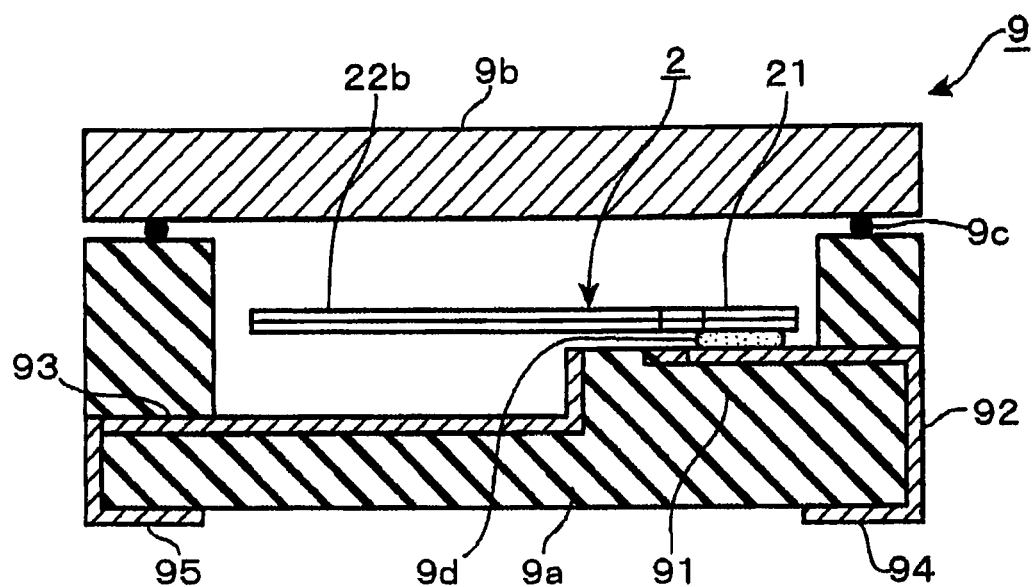
FIGS. 12A and 12B are configuration diagrams showing a package structure including the above-described quartz resonator.
Figure 12:
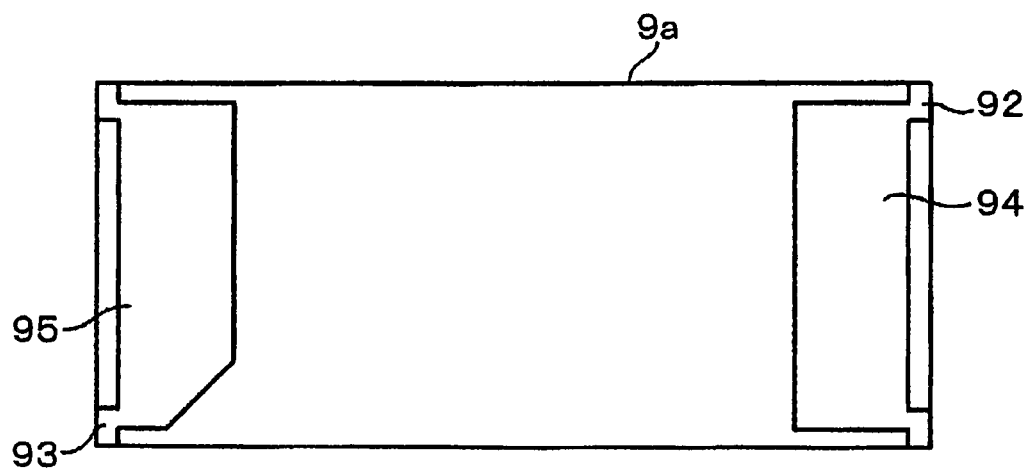

Further, the quartz resonator 2 separated from the bonded plate 5 is made up into, for instance, an electronic part housed in a package 9 made of ceramics in a surface mounted device (SMD) structure, as shown in FIGS. 12A and 12B. The package 9 includes a case 9a made of, for instance, ceramics, of which upper surface is opened, and a lid 9b made of, for instance, metal. The above-described case 9a and the lid 9b are seam welded via a seal agent 9c made of, for instance, a welding agent, and the inside thereof is in a vacuum condition. The above-described tuning fork type quartz resonator 2 is fixed to a pedestal 91 in a lying posture such that the pull out electrodes 32 and 42 of the base 21 are fixed to the pedestal 91 portion in the package 9 with conductive adhesive 9d, and the vibrating arms 22a and 22b are extended toward the space in the inside of the package 9. It should be noted that since the quartz resonator 2 has a symmetric shape with respect to the front and the back, occurrence of difference in characteristics as a quartz resonator product created depending on the selected surface to be bonded is reduced even when any side of the front or the back is selected as the surface to be bonded.

On the surface of the above-described pedestal 91, conductive paths 92 and 93 (93 is a conductive path inside the drawing) are wired, and the pull out electrodes 32 and 42 of the base 21 are connected to the conductive paths 92 and 93 via the conductive adhesive 9d. The above-described conductive paths 92 and 93 are respectively connected to electrodes 94 and 95 provided in a manner to face in the longitudinal direction of the outside bottom surface of the case 9a. As a result, the above-described quartz resonator 2 oscillates by applying current to the pull out electrodes 32 and 42 of the base 21 through the electrodes 94, 95, the conductive paths 92, 93 and the conductive adhesive 9d. Thus, the package 9 including the quartz resonator 2 is structured, and the package 9 is mounted on the wiring substrate (not shown) on which circuit parts of oscillation circuit are installed.

According to the above-described embodiment, the bonded plate 5 is formed by bonding two sheets of the original plates 51 and 52, which are Z plates made of quartz crystal so that the plus/minus directions of the X axis, a crystal axis, are in a reverse relation. After forming the metal films 61 and 61 to be a mask for etching the bonded plate 5 on the front and the back of the bonded plate 5, mask patterns are formed on these metal films 61 and 61 along the outer shape of the tuning fork type quartz piece 20 in a manner that the longitudinal direction of the outer shape thereof is orthogonal to the above-described X axis. Then, etching of the quartz substrate is conducted from both front and back surfaces of the bonded plate 5 to conduct the outer shape formation of the quartz piece 20. Since the directions of the X axes, crystal axes, are symmetrical with respect to the front and the back of the bonded plate 5 formed as above, the above-described etching also progresses symmetrically with respect to the front and the back, and since the difference in etching speed between axis directions toward +X and −X is small, the crotch portion 27 between the vibrating arms 22a and 22b of the quartz piece 20 is formed in a cone shape nearly symmetrical with respect to the front and the back and bilaterally symmetrical, so that increase in complicity in shape of the crotch portion 27 can be suppressed. Since the crotch portion 27 is formed in this fashion, excessive resist falls down on the slope of the crotch portion 27 when the resist is applied after forming the metal film 71 for forming the excitation electrode on the quartz portion 27, so that staying of the resist at the crotch portion 27 is reduced. Furthermore, since complication in shape of the crotch portion 27 is controlled, it is possible to suppress occurrence of insufficiently exposed places, where are not exposed sufficiently in the crotch portion 27 at the time of exposing the crotch portion 27 after application of resist. Accordingly, it is possible to reduce staying of the resist film 72 on the crotch portion 27 after development. As a result, it is possible to suppress lowering of yields of the quartz resonator 2 caused by short circuit of the excitation electrodes 31 and 41 on the right and left vibrating arms 22a, 22b of the quartz resonator 2 through the metal film 71 existing under the resist film 72 remaining there.

Figure 13:
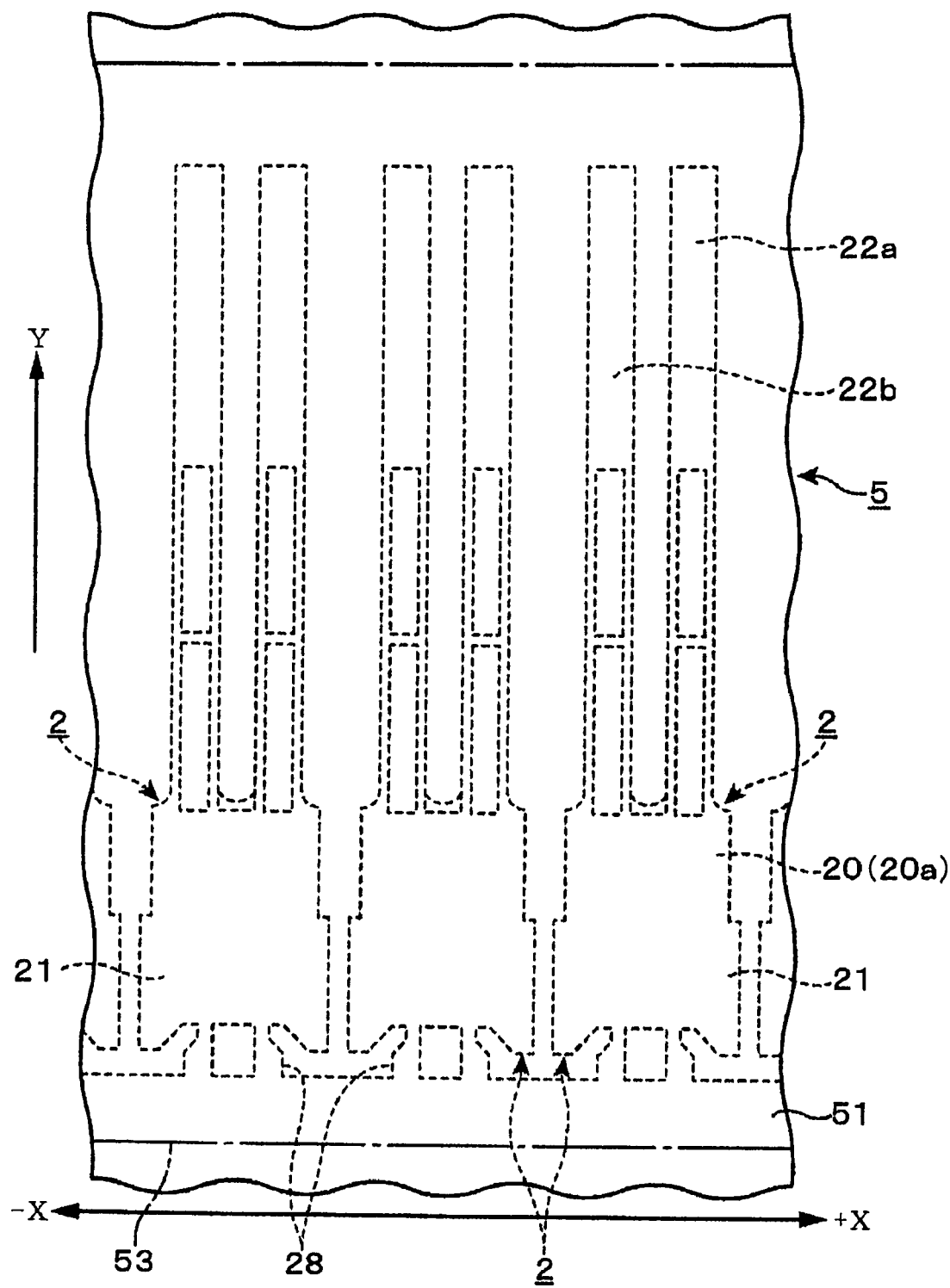
FIG. 13 is an explanatory view showing a region to form the quartz resonator to conduct a method of manufacturing another quartz resonator.

In the above-described embodiment, wet etching is conducted to the bonded plate 5 so that the right side surfaces of the segments 20a and 20b of the quartz piece 20 formed from the respective forming areas 53 to 55 face in the axis direction toward −X. However, it is also possible to form a quartz resonator by setting the respective forming areas in a manner that the right side surfaces of the respective segments 20a and 20b formed as shown in FIG. 13 face in the axis direction toward +X, and etching is conducted in the same process as in the above-described embodiment.

Figure 14:
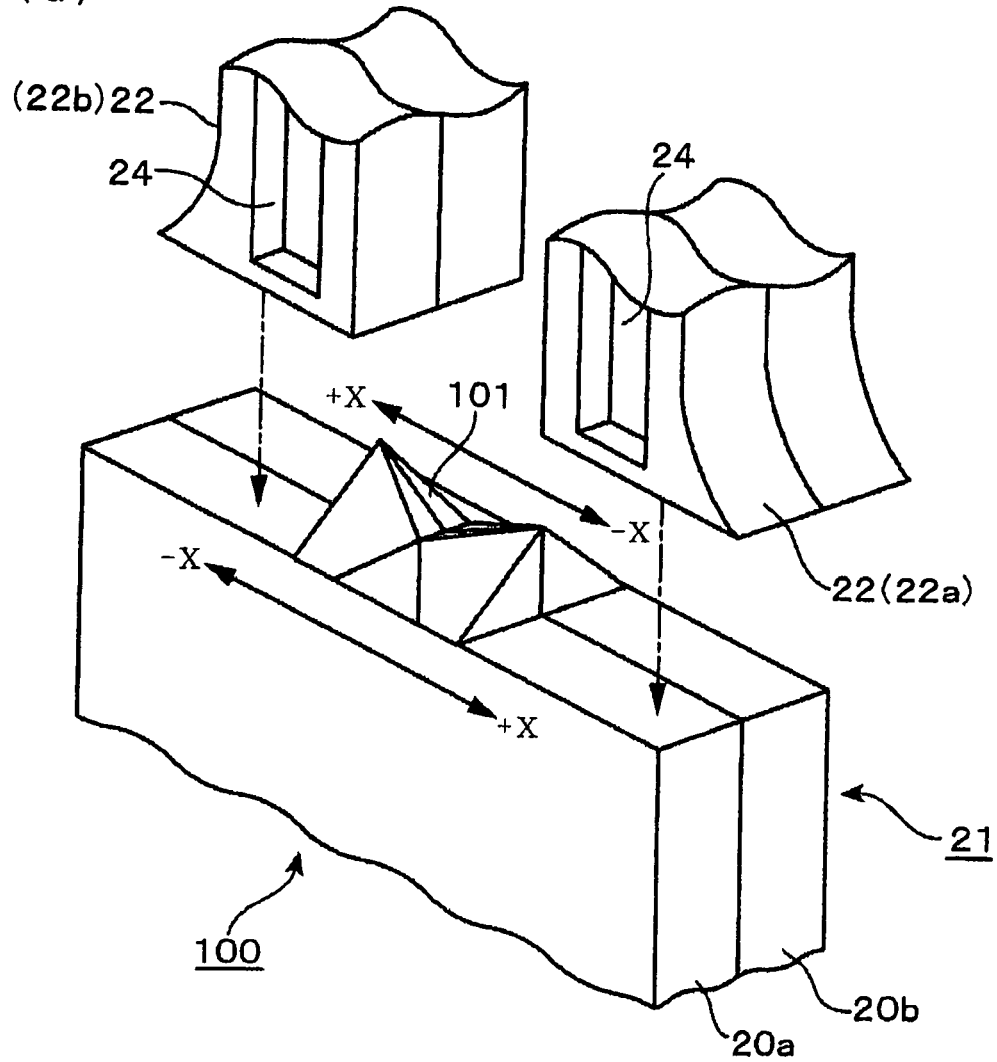
FIGS. 14A and 14B are explanatory views showing a configuration of the crotch portion of the quartz resonator manufactured by the above-described manufacturing method.
Figure 14:
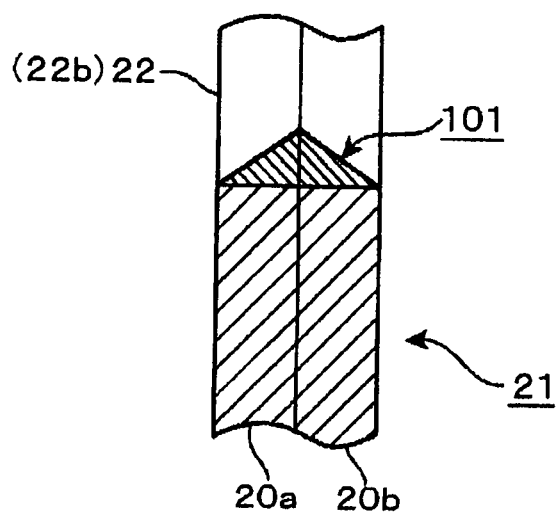
Figure 15:
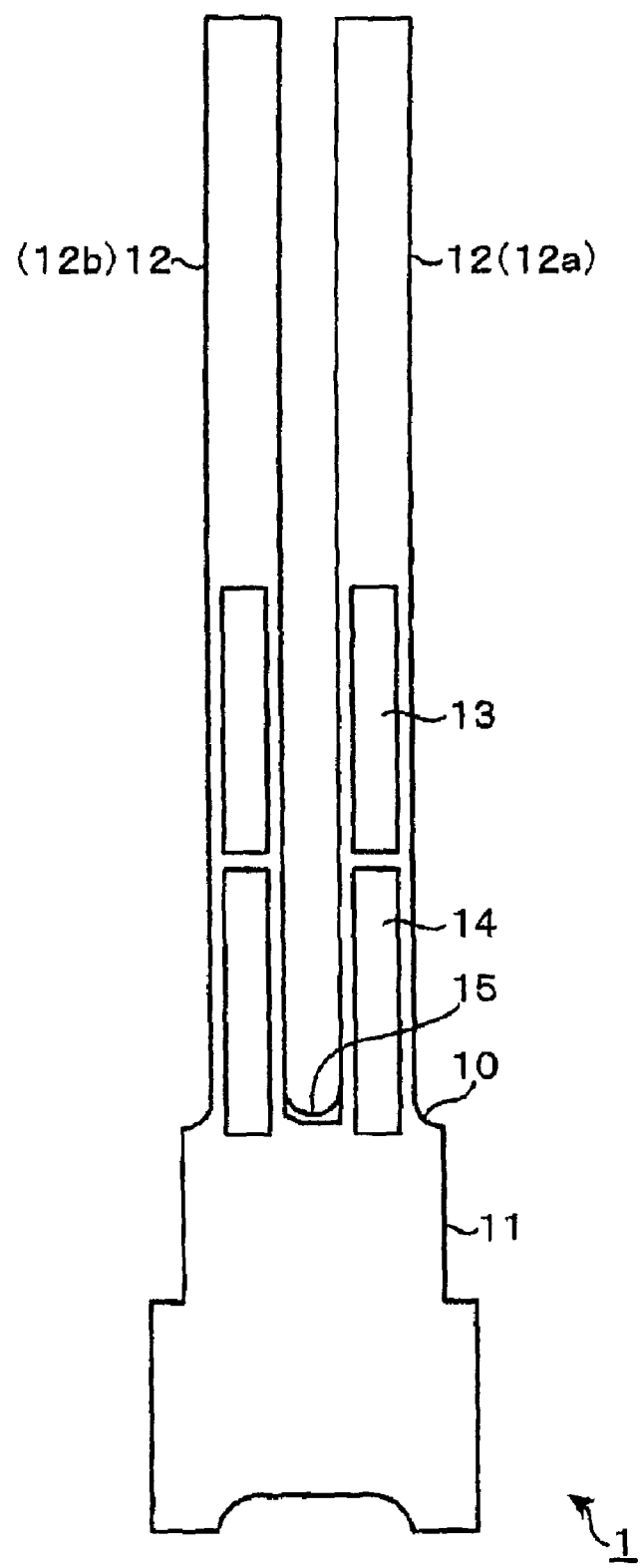
FIG. 15 is a configuration diagram of a conventional quartz resonator.
Figure 16:
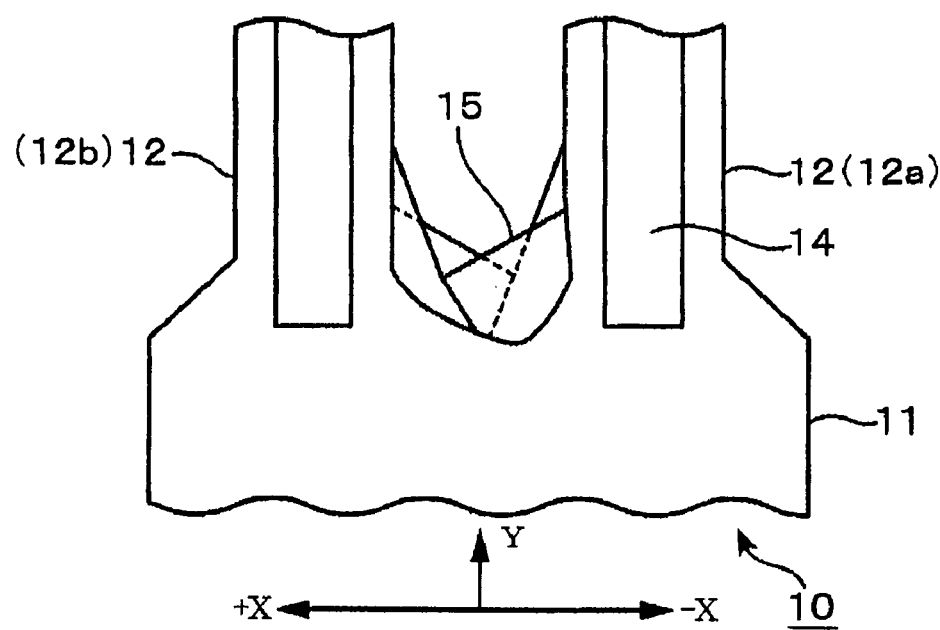
FIGS. 16A and 16B are explanatory views showing an example of the crotch portion of a conventional quartz resonator.
Figure 16:
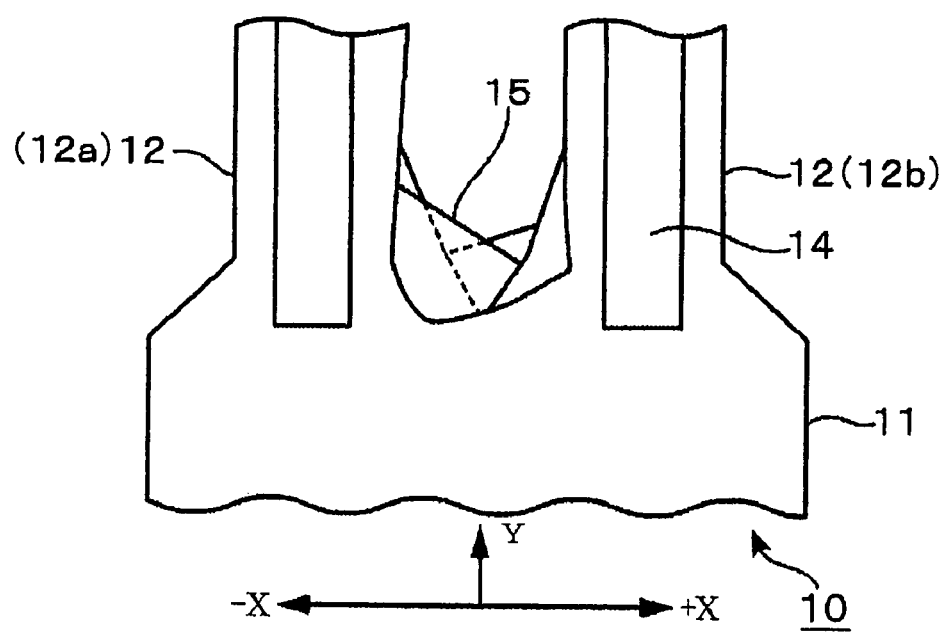
Figure 17:
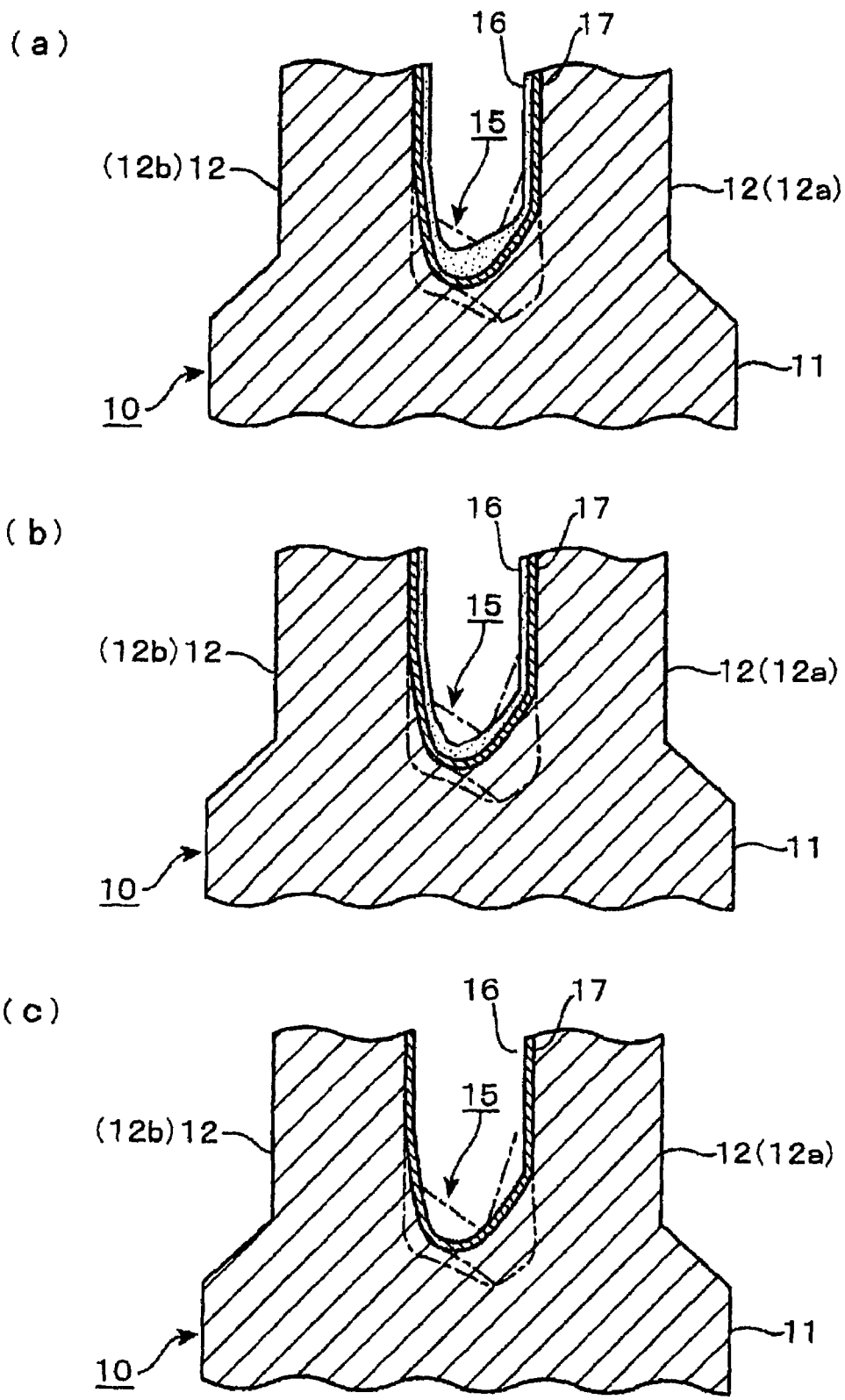
FIGS. 17A, 17B, and 17C are explanatory views showing that electrodes short circuit when a conventional quartz resonator is manufactured.

FIGS. 14A and 14B show the structure of a crotch portion 101 of a quartz resonator 100 formed by etching as above. Respective parts except the crotch portion 101 have structures similar to the above-described quartz resonator 2 and are shown by attaching the same symbols and numerals. The crotch portion 101 is formed so as to have a structure such that as if mountains lie in a row almost bilaterally symmetrically as shown in FIG. 14A, and symmetrically with respect to the front and the back as shown in FIG. 14B by the above-described etching, owing to the directional property of quartz crystal. Since complication in structure of the crotch portion 101 can be suppressed even in such a quartz resonator 100, it is possible to suppress accumulation of resist on the crotch portion 101 when applying the resist at the time of forming electrodes. It is also possible to reduce formation of insufficiently exposed parts produced because exposure beams are blocked at the time of exposure. Accordingly, the same effect as in the above-described embodiment can be obtained.

When the resist film 72 is formed on the vibrating arms 22a and 22b in order to form the excitation electrodes 31 and 41, a means to obtain a high covering property onto the side surface of the vibrating arms 22a and 22b is applied as described in the section of related art. Accordingly, it is possible to apply not only the above-described electrostatic spray method, but also, for instance, a dip method, in which the quartz resonator 2 is immersed in a resist solution so that the resist film 72 is formed on the whole surface of the quartz resonator 2.

What is claimed is:

1. A method of manufacturing a quartz resonator, including etching a quartz substrate, forming a quartz piece in a shape of a tuning fork in which two vibrating arms extend from a base, and forming electrodes in areas including side surfaces inside the vibrating arms of said quartz piece, comprising the steps of:
    forming said quartz substrate by bonding main surfaces of two sheets of original plates, which are made of quartz crystal, and main surfaces thereof are orthogonal to the direction of a Z axis, a crystal axis, so that the plus/minus directions of a X axis, another crystal axis, are made in a reverse relation to each other;
    forming an outer shape of the quartz piece by forming masks for the outer shape, through which the surfaces of the quartz substrate are exposed, on both front and back surfaces of said quartz substrate in a manner that the mask follows along the outer shape of said quartz piece and a width direction of the outer shape agrees with said X axis, and by etching the quartz substrate;
    forming a metal film to form said electrodes in areas including a crotch portion sandwiched between the side surface inside the respective vibrating arms and the respective vibrating arms of the quartz piece, after removing said mask for the outer shape;
    covering said metal film with a positive type resist film, of which exposed portion changes to be soluble;
    forming a resist pattern in which the metal film in the areas including said crotch portion is exposed, by exposing and developing said resist film using a mask to form electrode patterns to remove the exposed portions; and
    then, etching said metal film using the resist pattern to form electrodes.

2. The method of manufacturing the quartz resonator according to claim 1, wherein one of the electrodes is formed on the side surface inside one vibrating arm from said crotch portion toward a tip of the one vibrating arm, and at the same time, the other electrode is formed on the side surface inside the other vibrating arm from said crotch portion toward a tip of the other vibrating arm.

3. The method of manufacturing the quartz resonator according to claim 1, wherein one of the electrodes is formed at an edge of the crotch portion on one surface side of the quartz resonator, and the other electrode is formed at an edge of the crotch portion on the other surface side of the quartz substrate.

4. The method of manufacturing the quartz resonator according to claim 1, wherein the process to form said resist film is the electrostatic spray method or the dip method.

5. The method of manufacturing the quartz resonator according to claim 1, wherein the process to form the outer shape of the quartz piece is the one to form the crotch portion, which is nearly symmetrical with respect to a front and a back and bilaterally symmetrical in a standing state of the quartz piece and has a slope going down from a center of a width of the quartz piece toward the front and the back.

* * * * *